(12) United States Patent
Naito

(10) Patent No.: US 6,790,538 B2
(45) Date of Patent: Sep. 14, 2004

(54) ORGANIC ELECTROLUMINESCENT DEVICE AND DISPLAY APPARATUS

(75) Inventor: Katsuyuki Naito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 10/025,919

(22) Filed: Dec. 26, 2001

(65) Prior Publication Data

US 2002/0106531 A1 Aug. 8, 2002

(30) Foreign Application Priority Data

Dec. 28, 2000 (JP) ........................................ 2000-402663

(51) Int. Cl.[7] .............................................. H05B 33/14
(52) U.S. Cl. ...................... 428/690; 428/917; 313/504; 313/506; 257/40; 257/89; 257/102; 257/103
(58) Field of Search ................................ 428/690, 917; 313/504, 506; 257/40, 89, 102, 103

(56) References Cited

U.S. PATENT DOCUMENTS

| 5,281,489 | A | * | 1/1994 | Mori et al. .................. 428/690 |
| 5,663,573 | A | * | 9/1997 | Epstein et al. ................ 257/40 |
| 6,117,529 | A | * | 9/2000 | Leising et al. ............... 428/209 |
| 6,368,732 | B1 | * | 4/2002 | Jin et al. ..................... 428/690 |
| 6,414,104 | B1 | * | 7/2002 | Pei .............................. 528/86 |
| 6,495,273 | B1 | * | 12/2002 | Hwang et al. .............. 428/690 |
| 2002/0024293 | A1 | * | 2/2002 | Igarashi et al. ............. 313/483 |
| 2002/0193551 | A1 | * | 12/2002 | Pei .............................. 528/86 |

FOREIGN PATENT DOCUMENTS

| JP | 8-319482 | 12/1996 |
| JP | 11-256148 | 9/1999 |

OTHER PUBLICATIONS

M.A. Baldo et al., "Highly efficient phosphorescent emission from organic electroluminescent devices", Nature, vol. 395, pp. 151–154 (Sep. 10, 1998).*

* cited by examiner

*Primary Examiner*—Marie Yamnitzky
(74) *Attorney, Agent, or Firm*—Oblon, Spivak, McClelland, Maier & Neustadt, P.C.

(57) ABSTRACT

An organic EL device has an anode, a cathode, and a polymer luminescent layer disposed between the anode and the cathode, and contains a host molecule and a luminescent dye molecule, the host molecule being formed of a π-electron conjugated polymer having a carbon-fluorine bond, at least one type of luminescent dye molecule being selected from the group consisting of a transition metal complex and a linear π-electron conjugated molecule.

7 Claims, 1 Drawing Sheet

ORGANIC ELECTROLUMINESCENT DEVICE AND DISPLAY APPARATUS

CROSS-REFERENCE TO RELATED APPLICATIONS

This application is based upon and claims the benefit of priority from the prior Japanese Patent Application No. 2000-402663, filed Dec. 28, 2000, the entire contents of which are incorporated herein by reference.

BACKGROUND OF THE INVENTION

1. Field of the Invention

The present invention relates to an organic electroluminescent device (organic EL device) and a display apparatus, more specifically, to an organic EL device utilizing excited triplet states of a host molecule and a display apparatus using thereof.

2. Description of the Related Art

An organic EL device has features including, self-emission, thin and lightweight form, low electric power consumption, possibility for full color and the like. For these features, the organic EL device is recognized by those skilled in the art as a candidate for coming generation display having a possibility to surpass a liquid crystal display. However, the organic EL device has a drawback of insufficient emission efficiency, and there is a demand for improvement in emission efficiency for, in particular, a red-emitting and blue-emitting organic EL device.

In order to realize an organic EL device having high luminance and long life, an approach utilizing excited triplet states of a host molecule is known. When electrons and holes injected from a pair of electrodes are recombined in a luminescent layer, the host molecules are electronically excited. At that time, a ratio of generation probability of excited singlet states and that of excited triplet states is about 1:3. The excited singlet states contribute to emission by luminescent dye molecules, while the excited triplet states generally do not contribute to emission. However, in the case of using a type of luminescent dye molecule whose energy levels are highly degenerated such as a rare earth metal complex and a linear π-electron conjugated molecule, the dye molecules can emit light through not only energy transfer from the host molecules in excited singlet states to the dye molecules, but also energy transfer from the host molecules in excited triplet states to the dye molecules. From this viewpoint, an approach is proposed in that rare earth metal complexes are doped into the host molecules, and the energy of the host molecules in the excited triplet states is transferred to the rare earth metal complexes, thereby allowing the rare earth metal ions to emit light (Jpn. Pat. Appln. KOKAI Publication No. 8-319482).

However, conventional host molecules known in the art have significantly lower energy levels in excited triplet states than those in excited singlet states. Therefore, if a luminescent dye molecule is selected so that energy transfer from the host molecules in excited triplet states should be made easily, use efficiency of the energy of the host molecules in excited singlet state will be lowered. As a result, it has been not possible to improve emission efficiency of conventional organic EL devices.

As mentioned above, the conventional organic EL devices cannot utilize both the energy of the host molecules in excited singlet states and the energy of those in excited triplet states in efficient manners, making it impossible to allow the luminescent dye molecules to emit light efficiently.

BRIEF SUMMARY OF THE INVENTION

An object of the present invention is to provide an organic EL device showing high efficiency and long life that can utilize the energies of host molecules both in excited singlet states and in excited triplet states, and a display apparatus employing the organic EL device.

An organic electroluminescent device, comprising: an anode; a cathode; and a polymer luminescent layer disposed between the anode and the cathode, and comprising a host molecule and a luminescent dye molecule, the host molecule being formed of a π-electron conjugated polymer having carbon-fluorine bond, the luminescent dye molecule being capable of receiving energy from the host molecule both in an excited singlet state and in an excited triplet state.

An organic electroluminescent device, comprising: an anode; a cathode; and a polymer luminescent layer disposed between the anode and the cathode, and comprising a host molecule and a luminescent dye molecule, the host molecule being formed of a π-electron conjugated polymer having a carbon-fluorine bond, at least one type of luminescent dye molecule being selected from the group consisting of a transition metal complex and a linear π-electron conjugated molecule.

A display apparatus comprising, pixels arranged in a two-dimensional array, each pixel including multiple types of organic electroluminescent devices different in emission color, each organic electroluminescent device comprising an anode, a cathode, and a polymer luminescent layer disposed between the anode and the cathode; wherein the polymer luminescent layer of at least one type of organic EL device comprises a host molecule and a luminescent dye molecule, the host molecule being formed of a π-electron conjugated polymer having a carbon-fluorine bond, at least one type of luminescent dye molecule being selected from the group consisting of a transition metal complex and a linear π-electron conjugated molecule.

DETAILED DESCRIPTION OF THE INVENTION

Figure 1:
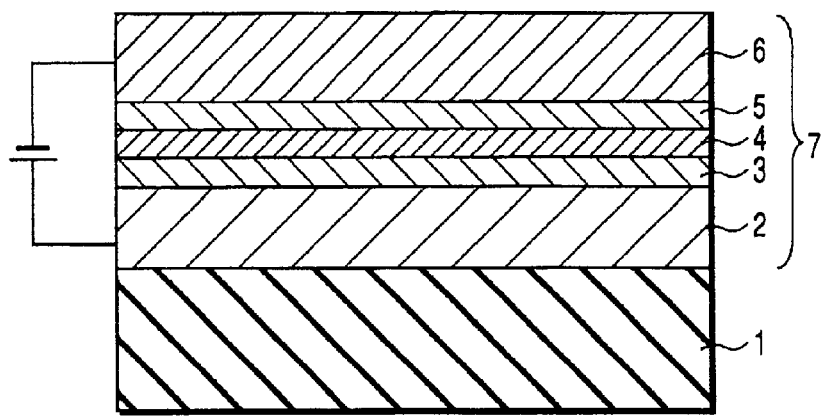
FIG. 1 is a schematic cross sectional view showing an organic EL device according to one embodiment of the present invention.

FIG. 1 shows an organic EL device according to one embodiment of the present invention. The organic EL device 7 shown in FIG. 1 is formed on a surface of the substrate 1. The organic EL device 7 has a structure that the anode 2, the hole transport layer 3, the polymer luminescent layer 4 containing host molecules doped with luminescent dye molecules, the electron transport layer or buffer layer 5, and the cathode 6 are laminated in this order onto the substrate 1.

Figure 2:
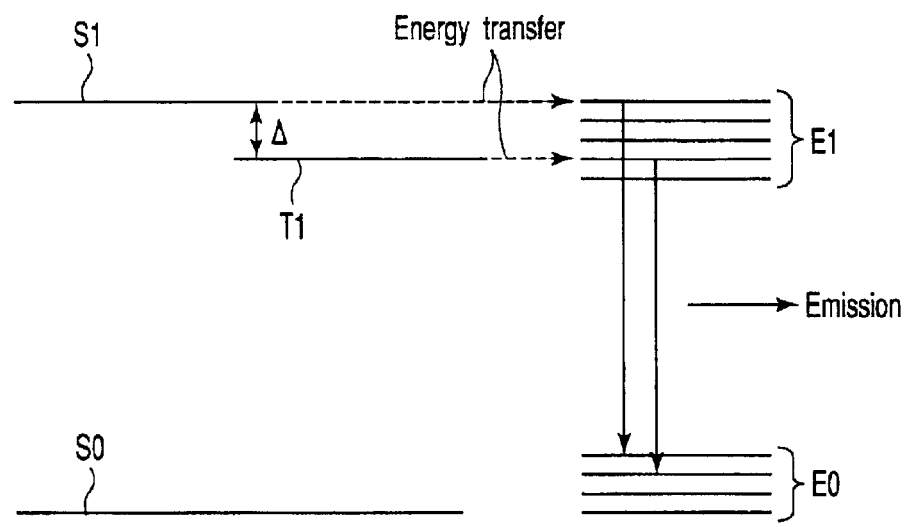
FIG. 2 is a diagram for explaining an emission mechanism of a luminescent dye molecule.

Referring to FIG. 2, an emission mechanism by the luminescent dye molecules is schematically shown. Holes supplied from the anode 2 reach via the hole transport layer 3 to the polymer luminescent layer 4, while electrons supplied from the cathode 6 reach via the electron transport layer or buffer layer 5 to the polymer luminescent layer 4. As a result, the holes and electrons are recombined in the polymer luminescent layer 4 by which the host molecules in the polymer luminescent layer 4 are excited. The excited host molecules have two types of energy states, i.e., singlet states and triplet states.

In FIG. 2, $S_0$ represents the energy level of the ground state, $S_1$ represents that of the excited singlet state, and $T_1$ represents that of the excited triplet state. Employed is a luminescent dye molecule, whose energy levels are degenerated, having multiple energy levels $E_1$ in a narrow region in the excited state and having multiple energy levels $E_0$ in a narrow region even in the ground state. Such luminescent dye molecule can efficiently receive energies from other molecules at various energy levels.

As mentioned previously, since conventional host molecules known in the art show significantly a low energy level of an excited triplet state in comparison with that of an excited singlet states, they cannot utilize efficiently the energies of the host molecule both in the excited singlet state and in the excited triplet state. On the other hand, if a host molecule is used that shows a small difference Δ between the energy level $S_1$ of the excited singlet state and the energy level $T_1$ of the excited triplet state, as shown in FIG. 2, it is expected that energy transfer from the host molecule to the luminescent dye molecule will be made efficiently as a whole.

The host molecule employed in the embodiments of the present invention is a π-electron conjugated polymer having a carbon-fluorine bond. The present inventor has found that when a part of hydrogen atoms bonded to carbon atoms constituting the π-electron conjugated system of the polymer is substituted by fluorine, the difference Δ between the energy level in the excited singlet state and the energy level in excited triplet state of the polymer may be decreased. Namely, when a carbon-fluorine bond is introduced to the polymer constituting a π-electron conjugated system, the excited singlet state is relatively more stabilized than the excited triplet state, and therefore the difference Δ becomes small. If the carbon atom substituted by a fluorine atom is a carbon atom in a conjugated system or a carbon atom adjacent to a carbon atom in the conjugated system, the difference Δ becomes further smaller. In a π-electron conjugated polymer having a phenylene skeleton or a fluorene skeleton, the difference Δ becomes still further smaller. Therefore, when such host molecule is used in combination with a luminescent dye molecule whose energy levels are highly degenerated, the efficiency of energy transfer from the host molecule to the luminescent dye molecule is improved.

In addition, the infrared absorption of a carbon-fluorine bond is found around 1000 cm$^{-1}$, smaller than that of a carbon-hydrogen bond around 3000 cm$^{-1}$, which means that the carbon-fluorine bond is hard to resonate with a high electron excitation energy. Accordingly, nonradiative thermal deactivation (return to the ground state from the excited state with releasing energy as thermal vibration) becomes unlikely to occur. As a consequence, the host molecule in the excited state transfers energy to the luminescent dye molecule efficiently, and emission efficiency of fluorescence or phosphorescence when the luminescent dye molecule returns to the ground state is improved.

A general π-electron conjugated polymer is excellent in hole injection property, while it is inferior in electron injection property. On the other hand, a π-electron conjugated polymer having a carbon-fluorine bond shows a lower lowest unoccupied molecular orbital (LUMO), and it becomes of both carrier injection property or electron injection property, which facilitates recombination between holes and electrons.

Through these effects, the organic EL device according to the embodiments of the present invention can improve the emission efficiency, making it possible to lower driving voltage and to attain long service life.

Hereinafter, materials employed for an organic EL device according to the embodiments of the present invention are explained in detail.

A luminescent dye molecule employed in the embodiments of the present invention is formed of a material whose energy levels are highly degenerated, as mentioned previously, and that receives energies efficiently from the host molecule in an excited singlet state and in an excited triplet state. Such luminescent dye molecule is selected from the group consisting of a transition metal complex and a linear π-electron conjugated molecule.

For example, a complex comprising a transition metal having d-electrons such as an iridium ion, as a luminescent center, has degenerated d-electron orbits. Also, a linear π-electron conjugated molecule has degenerated π-electron orbits, and shows weak spin-spin interaction because of a long distance between spins due to its linear molecular structure. In this case, the π-electron conjugated molecule may be an oligomer or a polymer. As the transition metal complex, a complex whose luminescent center is a rare earth metal having f electrons, for example, europium ion, is more preferable.

Specific examples of the luminescent dye molecules are, for examples, those compounds represented by the following chemical formula (D1) to (D8).

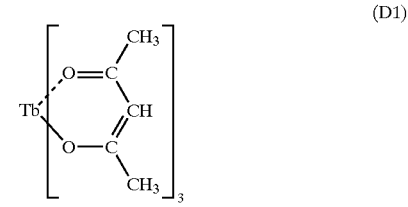

Tb (acac)$_3$

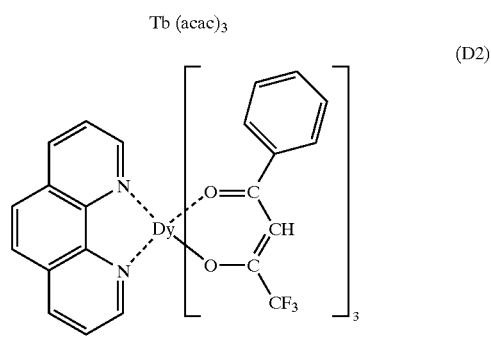

Dy(BTFA)$_3$Phen

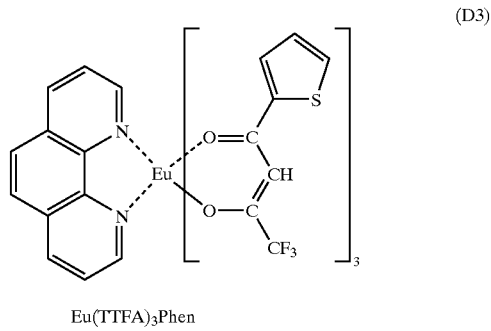

Eu(TTFA)$_3$Phen

-continued

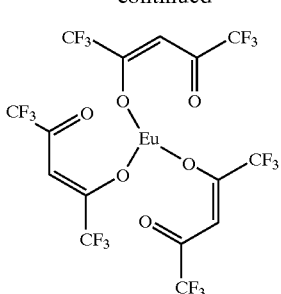
(D4)

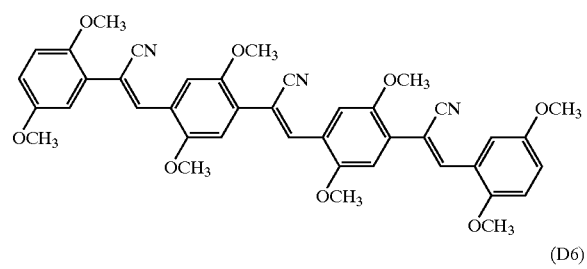
(D5)

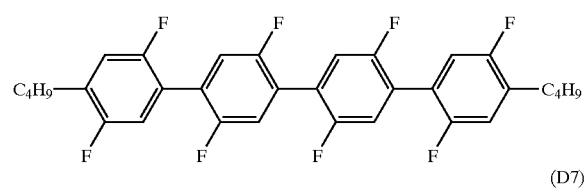
(D6)

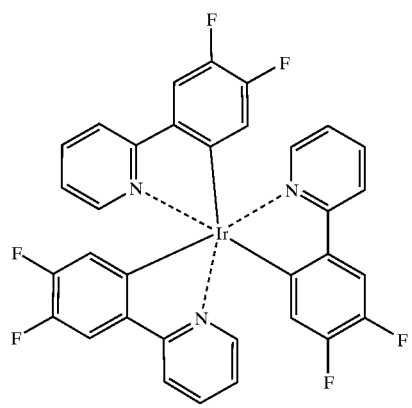
(D7)

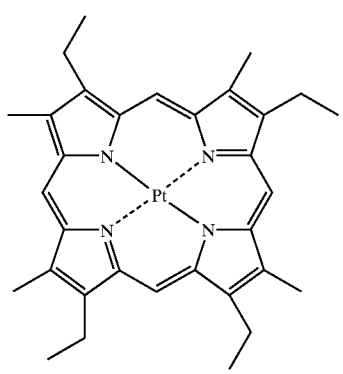
(D8)

The luminescent dye molecule may substantially determine an emission color of the organic EL device. For example, when a transition metal complex is used, it is possible to adjust emission wavelength by selecting a transition metal ion or a ligand appropriately. When a linear π-electron conjugated molecule is used, it is possible to adjust emission wavelength by selecting the skeleton thereof appropriately.

The host molecule used in the embodiments of the present invention is formed of a π-electron conjugated polymer having a carbon-fluorine bond. The π-electron conjugated polymer has a main chain in which double bonds and single bonds are arranged alternately. The double bond portion may be an aromatic ring or a hetero aromatic ring. As mentioned previously, it is preferable that the host molecule is formed of a π-electron conjugated polymer in which a fluorine atom is bonded to a carbon atom in a conjugated system or a carbon adjacent to a carbon in a conjugated system. In addition, it is preferred that the host molecule is formed of a π-electron conjugated polymer having a phenylene skeleton or a fluorene skeleton. Since the phenylene skeleton and fluorene skeleton are excellent in stability, and further enable to widen a band gap, they are preferably employed for a host molecule. The carbon atom linking the benzene rings in the fluorene skeleton functions to provide a planar configuration for the fluorene skeleton, and it is assumed to be a carbon atom included in the π-electron conjugated system.

Specific examples of host molecules are, for example, those compounds represented by the following chemical formula (H1) to (H11). However, it is not limited to these compounds, provided that the conditions mentioned above are satisfied.

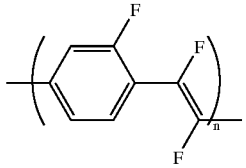
(H1)

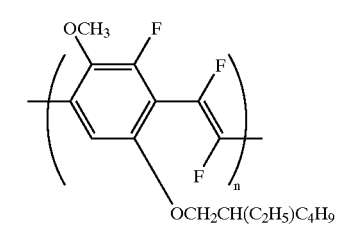
(H2)

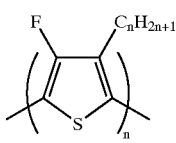
(H3)

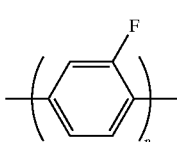
(H4)

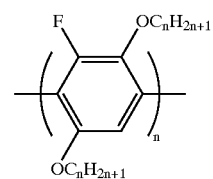 (H5)

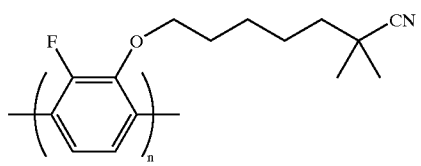 (H6)

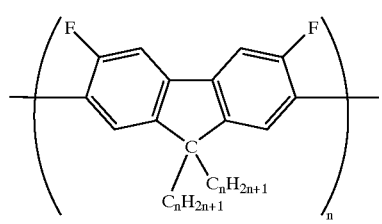 (H7)

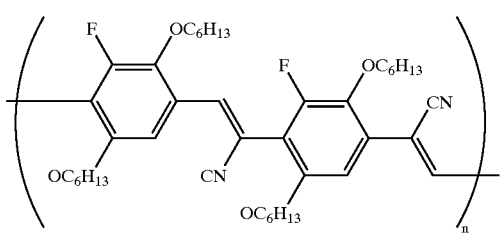 (H8)

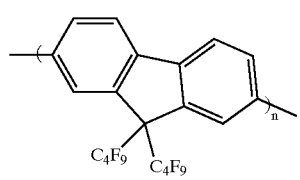 (H9)

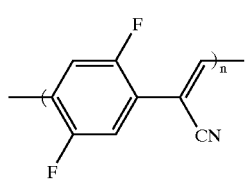 (H10)

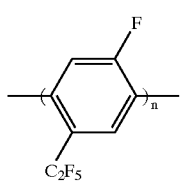 (H11)

Whether or not energy transfer occurs from a host molecule in excited triplet state to a luminescent dye molecule may be confirmed by the following measurements. For example, if phosphorescence spectrum of the host molecule only overlaps the absorption spectrum of the luminescent dye molecule, then it is known that energy transfer occurs. When the life of the host molecule in an excited triplet state measured by electron spin resonance spectrum or time-resolved phosphorescence spectrum is made shorter when the luminescent dye molecule is added to the host molecule than when the luminescent dye molecule is not added, then it is directly known that energy transfer is taking place.

The polymer luminescent layer of the organic EL device according to the embodiments of the present invention comprises the host molecule and the luminescent dye molecule as mentioned above. It is preferable that the amount of the luminescent dye molecule to be doped in the host molecule is about 0.01 wt % to 5 wt % to the host molecule. When the amount of the luminescent dye molecule exceeds 5 wt %, it is likely to cause problems such as concentration quenching and inhomogeneity in the polymer luminescent layer. When the amount of the luminescent dye molecule is less than 0.01 wt %, luminance of the polymer luminescent layer is lowered.

It is preferable that the thickness of the polymer luminescent layer is set to about 5 nm to 200 nm. If the thickness of the polymer luminescent layer exceeds 200 nm, driving voltage must be increased, and injected electrons or holes may be deactivated to lower recombination probability, resulting in degraded emission efficiency of the polymer luminescent layer. If the thickness of the polymer luminescent layer is less than 5 nm, it is difficult to form an even film, and it is afraid that emission characteristics may be uneven for each device. However, in the case where materials included in the polymer luminescent layer have also charge transport property or electron transport property, since deactivation of electrons or holes in the polymer luminescent layer is reduced, it is possible to make the thickness of the layer relatively thick. In this case, it is preferable that the thickness of the polymer luminescent layer is set to about 30 nm to 500 nm.

In the organic EL device according to the embodiments of the present invention, it is not necessarily required to provide an electron transport layer or a hole transport layer. For example, in the case where materials included in the polymer luminescent layer have also electron transport property or hole transport property as mentioned above, there is no need to form an electron transport layer or a hole transport layer.

An electron transport layer has a function to transport electrons supplied from a cathode to a polymer luminescent layer without deactivation, and so-called n-type semiconductor material is employed for the layer. A hole transport layer has a function to transport holes supplied from an anode to a polymer luminescent layer without deactivation, and so-called p-type semiconductor material is employed for the layer.

Specific examples of materials employed for the hole transport layer are represented by the following chemical formula (A1) to (A21). Specific examples of materials employed for the electron transport layer are represented by the following chemical formula (B1) to (B10).

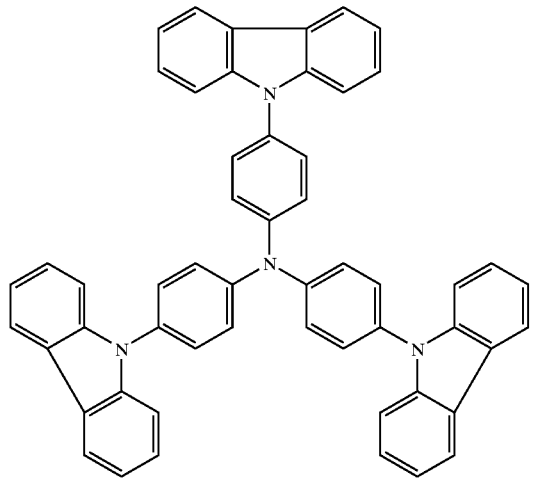
TCTA
(Tg = 101° C.)
(A1)
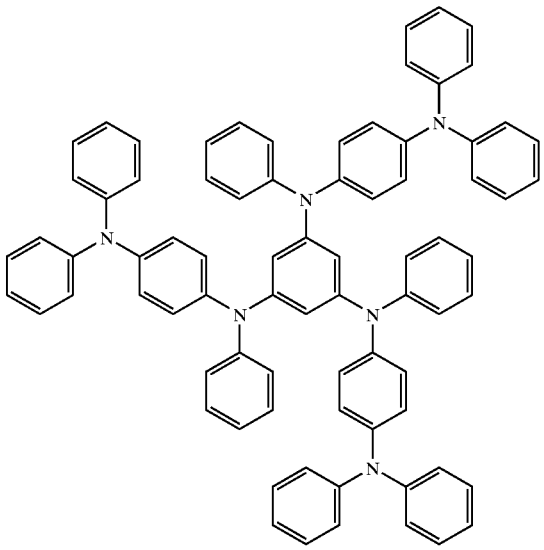
p-DPA-TDAB
(Tg = 108° C.)
(A2)
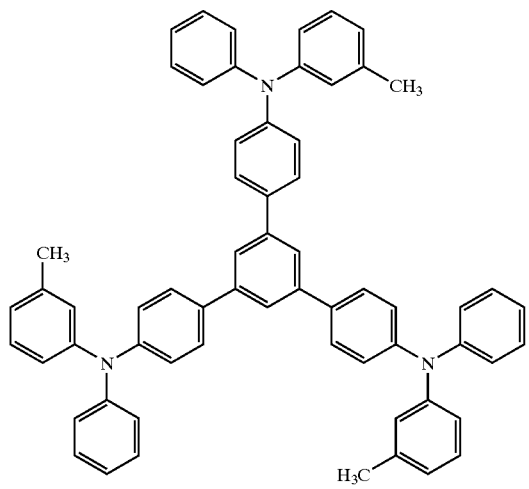
m-MTDAPB
(Tg = 105° C.)
(A3)
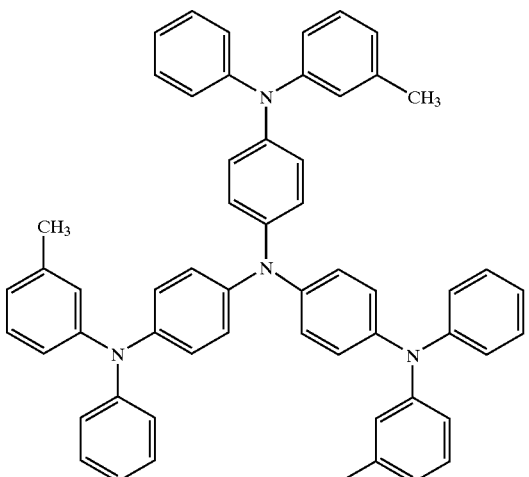
m-MTDATA
(Tg = 75° C.)
(A4)

-continued
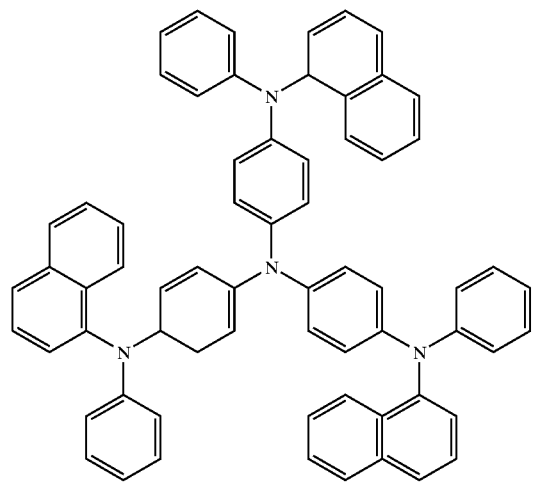
1-TNATA
(Tg = 113° C.)
(A5)
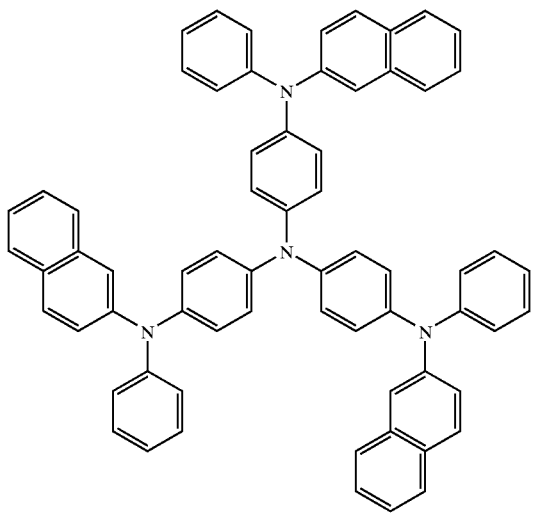
2-TNATA
(Tg = 110° C.)
(A6)
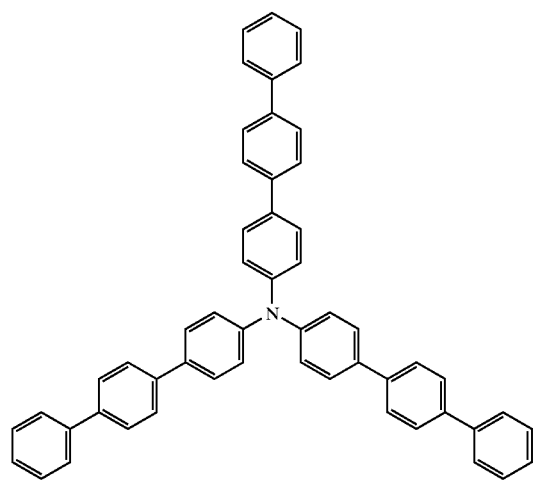
p-TTA
(Tg = 132° C.)
(A7)
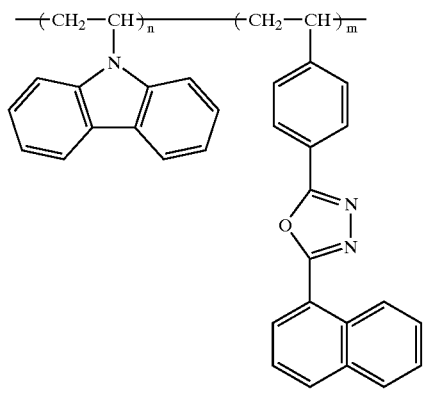
P(VK-co-OXD)
(A8)
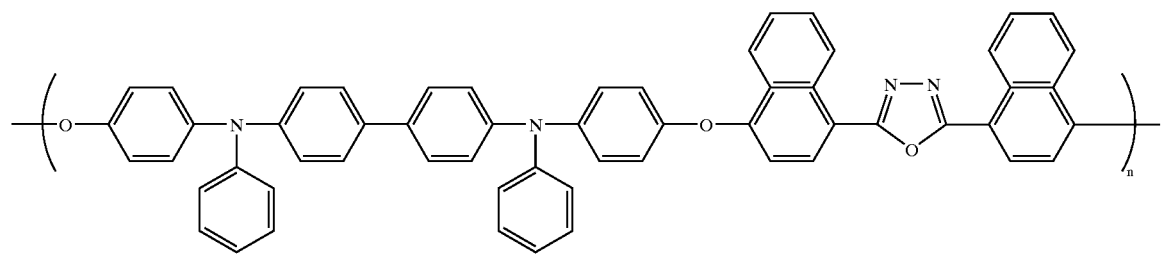
PTPDOXD
(A9)

-continued
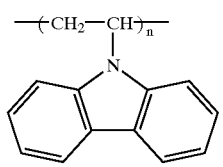
PVK (A10)
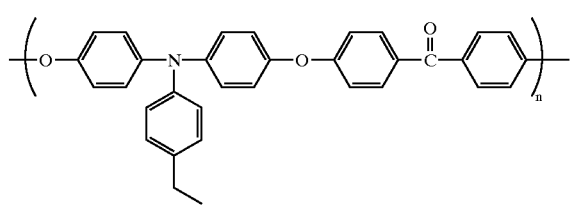
PTPAEK (A11)
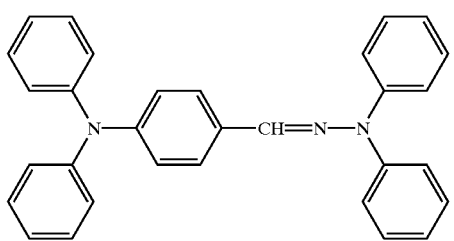
DPH (A12)
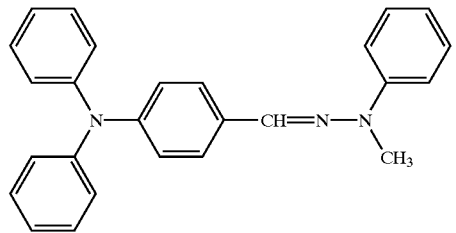
DPMH (A13)
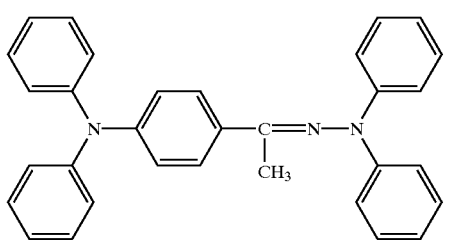
M-DPH (A14)
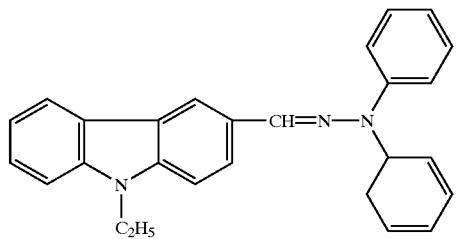
ECH (A15)
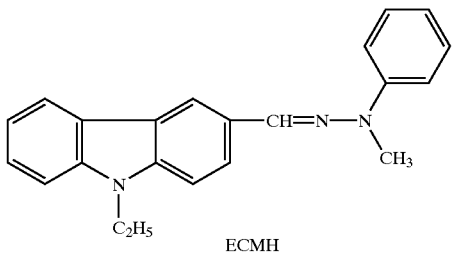
ECMH (A16)
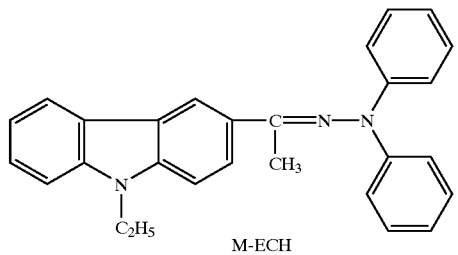
M-ECH (A17)
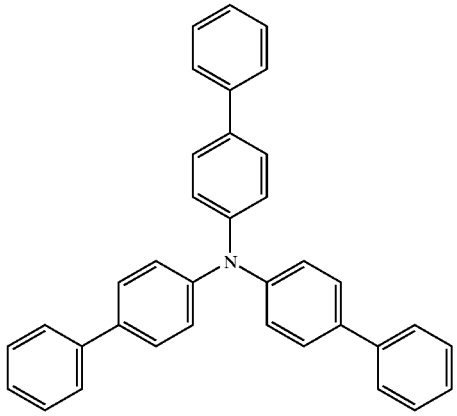
TBA (A18)
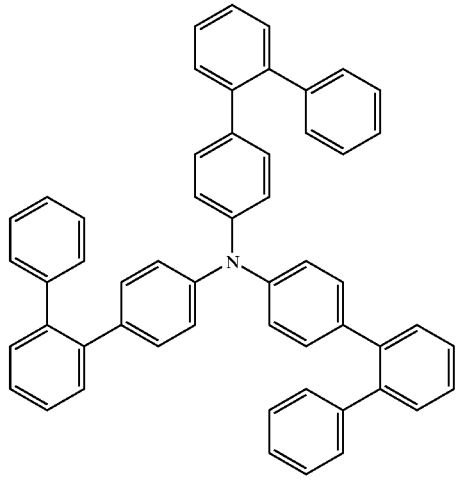
o-TTA (A19)

-continued
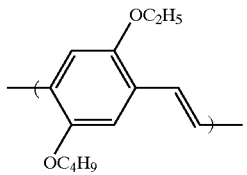
(A21)
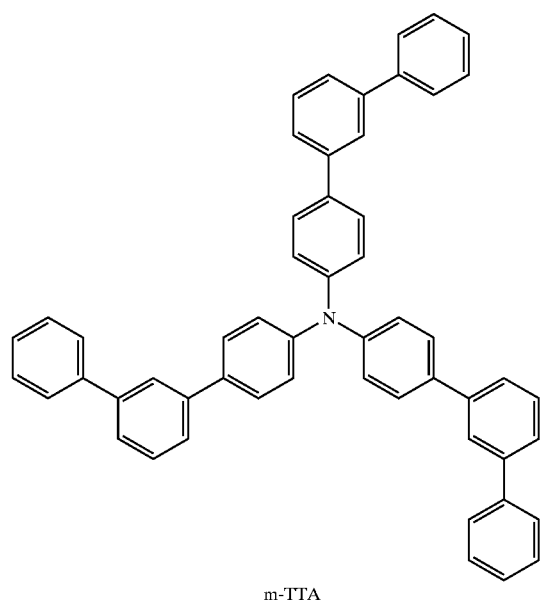
(A20)
m-TTA
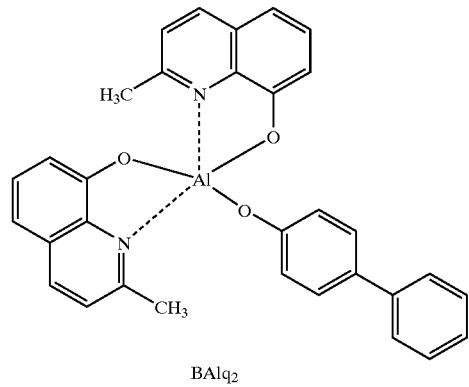
(B1)
BAlq₂
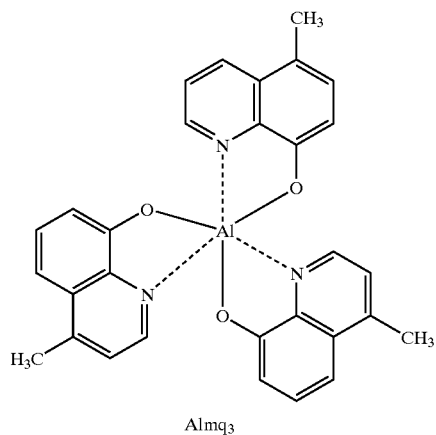
(B2)
Almq₃
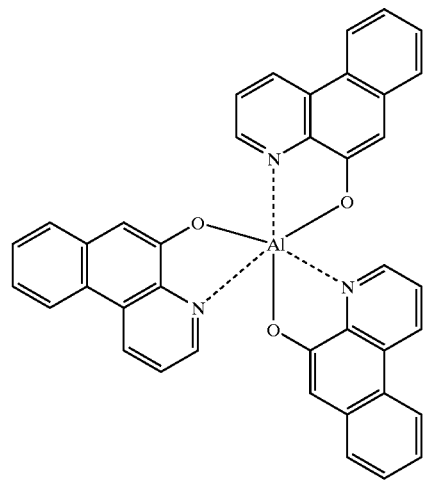
(B3)
Alph₃
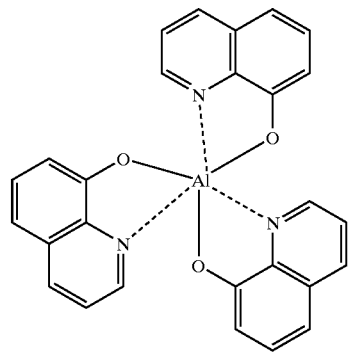
(B4)
Alq₃

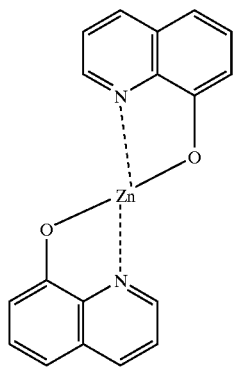

Znq₂

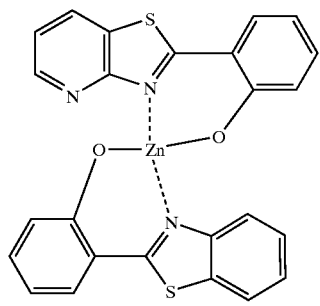

Zn(BTZ)₂

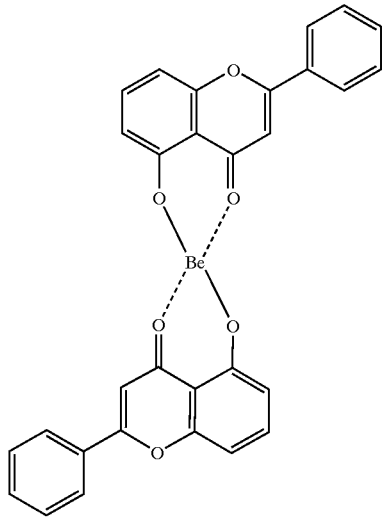

Be(5Fla)₂

-continued

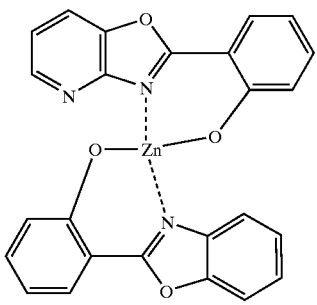

Zn(BOX)₂

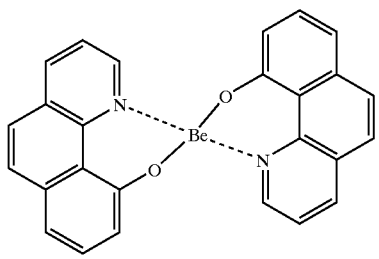

BeBq₂

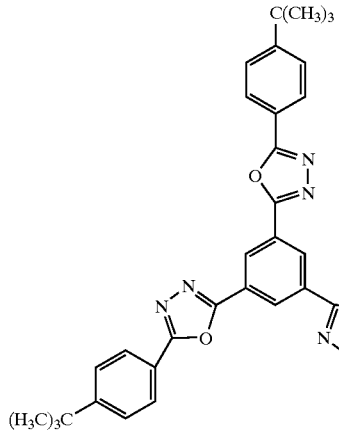

OXD-S1 (Tg = 137° C.)

It is preferred that the thickness of the electron transport layer or hole transport layer is set to about 30 nm to 200 nm. If the thickness is less than 30 nm, it is afraid that the functions mentioned above may not work sufficiently. If the thickness exceeds 200 nm, deactivation of electrons in an electron transport layer or deactivation of holes in a hole transport layer is increased, and it is afraid that emission efficiency of the luminescent layer may be lowered.

Although not illustrated in FIG. 1, if desired, a hole injection layer may be provided adjacent to the anode, and an electron injection layer may be provided adjacent to the cathode.

The hole injection layer functions as a buffer layer between the anode and the hole transport layer or between the anode and the polymer luminescent layer. By using materials having an intermediate energy level for the hole injection layer, it is possible to facilitate hole injection from the anode to the polymer luminescent layer. The hole injection layer may prevent electrons supplied from the cathode to the polymer luminescent layer from passing the polymer luminescent layer to reach the anode. Therefore, by forming the hole injection layer, recombination probability in the polymer luminescent layer is improved, leading to improved emission efficiency.

The electron injection layer functions as a buffer layer between the cathode and the electron transport layer or between the cathode and the polymer luminescent layer. By using materials having an intermediate energy level for the electron injection layer, it is possible to facilitate electron injection from the cathode to the polymer luminescent layer. The electron injection layer may prevent holes supplied from the anode to the polymer luminescent layer from passing the polymer luminescent layer to reach the cathode. Therefore, by forming the electron injection layer, recombination probability in the polymer luminescent layer is improved, leading to improved emission efficiency.

The anode and the cathode are made of conductive materials. The electrode disposed on the emission side of the anode and the cathode, employs transparent conductive oxide such as ITO or the like. Although the material for a substrate is not particularly limited, a transparent substrate made of glass and the like is employed in the case where the substrate side is used as emission surface.

The organic EL device according to the embodiments of the present invention may have a structure in which the respective layers mentioned above are stacked on the substrate in the reverse order to that shown in FIG. 1. The surface of the organic EL device may be covered with a sealing film made of insulator, so as to improve the strength and water resistance of the device. In the case of forming a sealing film onto the emission surface of the device, also a transparent material is used for the sealing film.

Figure 3:
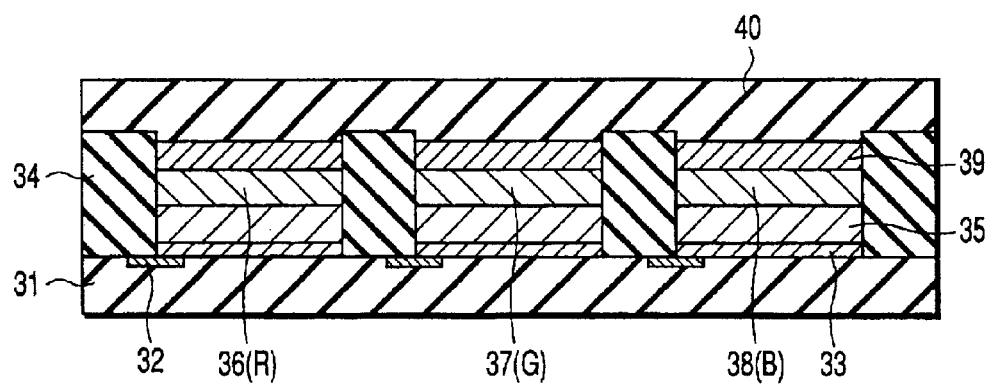
FIG. 3 is a cross sectional view showing a display apparatus according to one embodiment of the present invention.

Next, a display apparatus according to one embodiment of the present invention is described hereinafter. FIG. 3 is a schematic cross sectional view showing an example of a display apparatus according to the embodiment of the present invention. The partition wall 34 made of an insulator is formed on a surface of the insulating transparent substrate 31 made of glass or the like. Three types of organic EL devices different in emission color are formed in respective cells separated by the partition wall 34. Namely, three organic EL devices in which the anode 33 made of a transparent conductive oxide such as ITO, the hole transport layer 35, the polymer luminescent layer having electron transport property 36, 37 or 38, the cathode 39 made of a reflective metal are formed in this order on the surface of the substrate 31, which organic EL devices are separated by the partition wall 34. The polymer luminescent layer 36(R) includes a red-emitting luminescent dye molecule, the polymer luminescent layer 37(G) includes a green-emitting luminescent dye molecule, and the polymer luminescent layer 38(B) includes a blue-emitting luminescent dye molecule, respectively. Each organic EL device is connected to a transistor 32. Further, a sealing film 40 is formed on the top of these organic EL devices.

These three organic EL devices form a pixel. When voltage is applied between an anode and a cathode of a desired organic EL device selected by the transistor 32, emission of a desired color is emitted from the polymer luminescent layer 36, 37 or 38. The emission can be observed on the side of the transparent substrate 1. By arranging pixels as shown in FIG. 3 in a two-dimensional array, it is possible to fabricate a display apparatus.

Note that, in the display apparatus according to the present embodiment, there is no need for all of the three organic EL devices forming the pixel to have a polymer luminescent layer comprising a host molecule formed of a π-electron conjugated polymer having a carbon-fluorine bond and a luminescent dye molecule selected from the group consisting of a transition metal complex and a linear π-electron conjugated molecule. For example, conventional red-emitting and blue-emitting organic EL devices have lower luminance in comparison with a green-emitting organic EL device. Therefore, only for the red-emitting and blue-emitting organic EL devices, the polymer luminescent layer comprising a host molecule formed of a π-electron conjugated polymer having a carbon-fluorine bond and a luminescent dye molecule selected from the group consisting of a transition metal complex and a linear π-electron conjugated molecule may be employed, and a conventional organic EL device may be employed for the green-emitting organic EL device.

In the above description, the method wherein electron and hole are recombined in polymer luminescent layer and thereby the host molecule is excited has been explained, but the present invention is not limited to this method. For example, by radiating excited light to the host molecule and exciting it, it is also available to make the polymer luminescent layer emit.

EXAMPLES

Example 1

A glass substrate on which an ITO layer is formed as an anode is subjected to ultraviolet and ozone cleaning. Then, a hole transport layer made of the compound shown in the above-mentioned chemical formula (A21) having a thickness of about 30 nm is formed on the surface of the anode by spin coating.

A host molecule formed of π-electron conjugated polymer shown in the chemical formula (H9) doped with 0.5 wt % of a luminescent dye molecule formed of an europium complex shown in the chemical formula (D4) is prepared. The material is applied to the surface of the hole transport layer by spin coating to form a polymer luminescent layer having a thickness of about 100 nm.

Further, a barium (Ba) layer as a cathode to having a thickness of about 200 nm is formed on the surface of the polymer luminescent layer to fabricate an organic EL device. The obtained organic EL device is airtight packaged in a dry glove box.

Emission characteristics of the organic EL device are examined with driving the device under the conditions of 13V of bias voltage and 20 mA/cm$^2$ of current density. The organic EL device shows red emission with luminance of 600 cd/m$^2$. When the organic EL device is driven continuously under the same conditions as above to measure luminance half-life, it is found to be 11,000 hours. The life of the excited triplet state of the host molecule measured from electron spin resonance spectrum is 50 μs.

On the other hand, the life of the excited triplet state of the host molecule under absence of the luminescent dye molecule measured from time-resolved phosphorescence spectrum is 1 ms.

Namely, it has been confirmed that, in the organic EL device of the present embodiment, the life of the excited triplet state of the host molecule is shortened, which shows the energy of the host molecule in the excited triplet state transfers to the luminescent dye molecule.

Comparative Example 1

An organic EL device is fabricated in the same manners as in the Example 1 except that a π-electron conjugated polymer not having a carbon-fluorine bond shown in the following chemical formula (H12) is used as a host molecule in place of the polymer shown in the chemical formula (H9), and further the organic EL device is airtight packaged in a dry glove box.

Emission characteristics of the organic EL device are examined with driving the device under the conditions of 15V of bias voltage and 20 mA/cm$^2$ of current density. The organic EL device shows red emission with luminance of 450 cd/m$^2$. The device of the Comparative Example 1 shows lower luminance compared with that in Example 1, even though the driving voltage is increased.

From the results of the Example 1 and the Comparative Example 1, it is understood that emission characteristics are improved by substituting a part of hydrogen atoms in a host molecule with fluorine atoms.

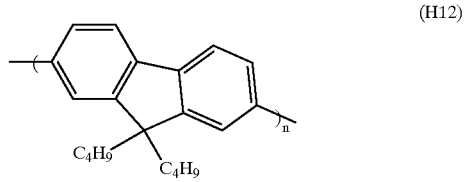

(H12)

Comparative Example 2

An organic EL device is fabricated in the same manners as in the Example 1 except that a compound shown in the following chemical formula (D9) is used as a luminescent dye molecule in place of the compound shown in the chemical formula (D4), and further the organic EL device is airtight packaged in a dry glove box. The compound of the chemical formula (D9) does not receive energy from the host molecule in an excited triplet state, but receives energy from the host molecule in an excited singlet state and shows red emission.

Emission characteristics of the organic EL device are examined with driving the device under the conditions of 16V of bias voltage and 20 mA/cm$^2$ of current density. The organic EL device shows red emission with luminance of 300 cd/m$^2$. The device of the Comparative Example 2 shows lower luminance compared with that in Example 1, even though the driving voltage is increased.

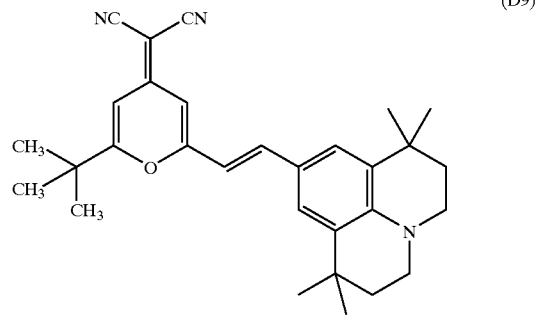

(D9)

Example 2

An organic EL device is fabricated in the same manners as in the Example 1 except that a polymer shown the chemical formula (H10) is used as a host molecule, and further the organic EL device is airtight packaged in a dry glove box.

Emission characteristics of the obtained organic EL device are examined in the same manners as in the Example 1. The organic EL device shows red emission with luminance of 550 cd/m$^2$, and luminance half-life of 11,000 hours.

Also, in the same manner as in the Example 1, the life of an excited triplet state of the host molecule in this organic EL device is compared with the life of excited triplet state of the host molecule under absence of the luminescent dye molecule, and the former is found to be 60 μs, while the latter is found to be 2 ms.

Example 3

An organic EL device is fabricated in the same manners as in the Example 1 except that a linear π-electron conjugated oligomer shown in the chemical formula (D5) is used as a luminescent dye molecule in place of the europium complex shown in the chemical formula (D4), and further the organic EL device is airtight packaged in a dry glove box.

Emission characteristics of the organic EL device are examined with driving the device under the conditions of 14V of bias voltage and 20 mA/cm$^2$ of current density. The organic EL device shows red emission with luminance of 500 cd/m$^2$. The luminance half-life is found to be 12,000 hours.

Also, in the same manner as in the Example 1, the life of an excited triplet state of the host molecule in this organic EL device is compared with the life of excited triplet state of the host molecule under absence of the luminescent dye molecule, and the former is found to be 100 μs, while the latter is found to be 1 ms.

Example 4

An organic EL device is fabricated in the same manners as in the Example 1 except that a linear π-electron conjugated oligomer shown in the chemical formula (D6) is used as a luminescent dye molecule in place of the europium complex shown in the chemical formula (D4), and a polymer shown in the chemical formula (H11) is used as a host molecule in place of the polymer shown in the chemical formula (H9), and further the organic EL device is airtight packaged in a dry glove box.

Emission characteristics of the organic EL device are examined with driving the device under the conditions of 12V of bias voltage and 20 mA/cm$^2$ of current density. The organic EL device shows blue emission with luminance of 500 cd/m$^2$. The luminance half-life is found to be 12,000 hours.

Also, in the same manner as in the Example 1, the life of an excited triplet state of the host molecule in this organic EL device is compared with the life of excited triplet state of the host molecule under absence of the luminescent dye molecule, and the former is found to be 20 μs, while the latter is found to be 500 μs.

Example 5

An organic EL device is fabricated in the same manners as in the Example 1 except that a platinum complex shown in the chemical formula (D8) is used as a luminescent dye molecule in place of the europium complex shown in the chemical formula (D4), and further the organic EL device is airtight packaged in a dry glove box.

Emission characteristics of the organic EL device are examined with driving the device under the conditions of 12V of bias voltage and 20 mA/cm² of current density. The organic EL device shows red emission with luminance of 700 cd/m². The luminance half-life is found to be 11,000 hours.

Also, in the same manner as in the Example 1, the life of an excited triplet state of the host molecule in this organic EL device is compared with the life of excited triplet state of the host molecule under absence of the luminescent dye molecule, and the former is found to be 20 μs, while the latter is found to be 100 μs.

Example 6

An organic EL device is fabricated in the same manners as in the Example 1 except that an iridium complex shown in the chemical formula (D7) is used as a luminescent dye molecule in place of the europium complex shown in the chemical formula (D4), and further the organic EL device is airtight packaged in a dry glove box.

Emission characteristics of the organic EL device are examined with driving the device under the conditions of 12V of bias voltage and 20 mA/cm² of current density. The organic EL device shows blue-green emission with luminance of 700 cd/m². The luminance half-life is found to be 12,000 hours.

Also, in the same manner as in the Example 1, the life of an excited triplet state of the host molecule in this organic EL device is compared with the life of excited triplet state of the host molecule under absence of the luminescent dye molecule, and the former is found to be 1 μs, while the latter is found to be 5 μs.

Example 7

A display apparatus of 2.5-inch square is fabricated by use of the following materials. In this case, each pixel is structured so as to include three organic EL devices as shown in FIG. 3, and the size of one pixel is made so as to be 100-μm square.

A glass substrate is employed as the substrate 31, and the partition wall 34 in a lattice shape is formed by photo resist process. The anode 33 is formed of indium tin oxide (ITO) as a transparent conductive material with a thickness of about 50 nm. The hole transport layer 35 is formed of a PEDOT-PSS complex shown in the following chemical formula (A22) with a thickness of about 20 nm by dipping method.

Different materials are used respectively for the polymer luminescent layer in three devices constituting a pixel. The red-emitting polymer luminescent layer 36 uses a material comprising the host molecule shown in the chemical formula (H10) doped with 0.5 wt % of the luminescent dye molecule shown in the chemical formula (D4). The green-emitting polymer luminescent layer 37 uses a material comprising the host molecule shown in the chemical formula (H10) doped with 0.5 wt % of the luminescent dye molecule shown in the chemical formula (D10). The blue-emitting polymer luminescent layer 38 uses a material comprising the host molecule shown in the chemical formula (H9) doped with 0.5 wt % of the luminescent dye molecule shown in the chemical formula (D6). Each material is dissolved in an organic solvent, and made into a film by ink jet printing. The formed polymer luminescent layers have almost the same thickness of about 80 nm.

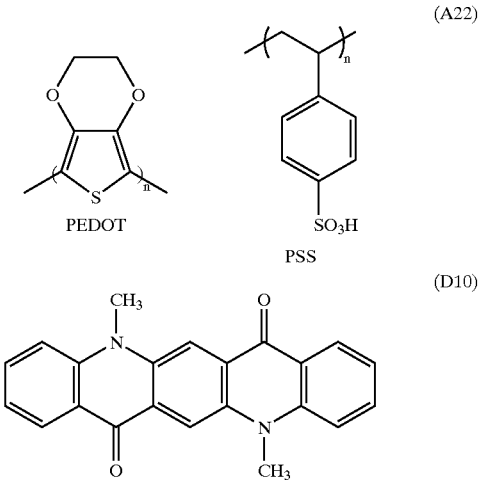

The cathode 39 is formed of calcium with a thickness of about 100 nm and silver with a thickness of about 300 nm, which are stacked in this order. Further the sealing film 40 is formed on the top surface of the respective pixels to package the devices.

The luminance half-life of the display apparatus measured with driving the apparatus under current density of 20 mA/cm² is found to be 15,000 hours.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic electroluminescent device, comprising:
   an anode;
   a cathode; and
   a polymer luminescent layer disposed between the anode and the cathode, and comprising a host molecule and a luminescent dye molecule,
   the host molecule being formed of a π-electron conjugated polymer having a phenylene skeleton or a fluorine skeleton in a main chain thereof and having a fluorine atom bonded to a carbon atom in a π-electron conjugated system or a fluorine atom bonded to a carbon atom adjacent to a carbon atom in a π-electron conjugated system, and
   the luminescent dye molecule being selected from the group consisting of a transition metal complex and a linear π-electron conjugated molecule.

2. The device according to claim 1, wherein a phosphorescence spectrum of the host molecule overlaps an absorption spectrum of the luminescent dye molecule.

3. The device according to claim 1, wherein the luminescent dye molecule comprises a transition metal complex, which is a rare earth metal complex.

4. The device according to claim 1, wherein the polymer luminescent layer comprises the host molecule doped with about 0.01 to 5 wt % of the luminescent dye molecule.

5. The device according to claim 1, wherein a hole transport layer is disposed between the anode and the polymer luminescent layer.

6. The device according to claim 1, wherein an electron transport layer or buffer layer is disposed between the cathode and the polymer luminescent layer.

7. A display apparatus comprises:

pixels arranged in a two-dimensional array, each pixel including multiple organic electroluminescent devices different in emission color, each organic electroluminescent device comprising an anode, a cathode, and a polymer luminescent layer disposed between the anode and the cathode;

wherein the polymer luminescent layer of at least one organic EL device comprises a host molecule and a luminescent dye molecule, the host molecule being formed of a π-electron conjugated polymer having a phenylene skeleton or a fluorine skeleton in a main chain thereof and having a fluorine atom bonded to a carbon atom in a π-electron conjugated system or a fluorine bonded to a carbon atom adjacent to a carbon atom in a π-electron conjugated system, and the luminescent dye molecule being selected from the group consisting of a transition metal complex and a linear π-electron conjugated molecule.

* * * * *